United States Patent
Theuss

(10) Patent No.: US 11,784,144 B2
(45) Date of Patent: Oct. 10, 2023

(54) SEMICONDUCTOR DEVICES COMPRISING PLANAR WAVEGUIDE TRANSMISSION LINES

(71) Applicant: Infineon Technologies AG, Neubiberg (DE)

(72) Inventor: Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 492 days.

(21) Appl. No.: 16/885,780

(22) Filed: May 28, 2020

(65) Prior Publication Data

US 2020/0388583 A1 Dec. 10, 2020

(30) Foreign Application Priority Data

Jun. 6, 2019 (DE) .......................... 102019115307.7

(51) Int. Cl.
| | |
|---|---|
| *H01L 23/66* | (2006.01) |
| *H01L 23/528* | (2006.01) |
| *H01L 23/522* | (2006.01) |
| *H01L 25/18* | (2023.01) |
| *H01L 23/538* | (2006.01) |
| *H01L 23/31* | (2006.01) |
| *H01L 23/552* | (2006.01) |
| *H01L 23/00* | (2006.01) |

(52) U.S. Cl.
CPC .......... *H01L 23/66* (2013.01); *H01L 23/3121* (2013.01); *H01L 23/5222* (2013.01); *H01L 23/5226* (2013.01); *H01L 23/5227* (2013.01); *H01L 23/5283* (2013.01); *H01L 23/5386* (2013.01); *H01L 24/20* (2013.01); *H01L 24/24* (2013.01); *H01L 25/18* (2013.01); *H01L 23/552* (2013.01); *H01L 2223/6616* (2013.01); *H01L 2223/6627* (2013.01);

(Continued)

(58) Field of Classification Search
CPC ............. H01L 23/3121; H01L 23/5222; H01L 23/5226; H01L 23/5227; H01L 23/5283; H01L 23/5286; H01L 23/552; H01L 23/66; H01L 2223/6616; H01L 2223/6627; H01L 2223/6677; H01L 24/20; H01L 24/24; H01L 2224/04105; H01L 2224/12105; H01L 2224/16227; H01L 2224/24137; H01L 25/18; H01L 2225/1035

See application file for complete search history.

(56) References Cited

U.S. PATENT DOCUMENTS

| | | | |
|---|---|---|---|
| 7,233,061 B1 * | 6/2007 | Conn ...................... | H01L 23/50 257/E23.079 |
| 10,025,047 B1 | 7/2018 | Liu et al. | |

(Continued)

FOREIGN PATENT DOCUMENTS

| | | |
|---|---|---|
| DE | 693 13 901 T2 | 10/1993 |
| DE | 11 2016 000 846 T5 | 11/2017 |

(Continued)

*Primary Examiner* — Brigitte A Paterson
(74) *Attorney, Agent, or Firm* — Harrity & Harrity, LLP

(57) ABSTRACT

A semiconductor device comprises a first semiconductor chip, a first planar waveguide transmission line arranged within a BEOL metal stack of the first semiconductor chip, wherein the first planar waveguide transmission line comprises line sections situated opposite one another, and a second planar waveguide transmission line arranged over the first semiconductor chip and electrically coupled to the first planar waveguide transmission line, wherein the second planar waveguide transmission line comprises line sections situated opposite one another.

17 Claims, 5 Drawing Sheets

(52) U.S. Cl.
CPC ............. *H01L 2223/6677* (2013.01); *H01L 2224/04105* (2013.01); *H01L 2224/12105* (2013.01); *H01L 2224/16227* (2013.01); *H01L 2224/24137* (2013.01); *H01L 2225/1035* (2013.01); *H01L 2924/19031* (2013.01); *H01L 2924/19032* (2013.01); *H01L 2924/19033* (2013.01); *H01L 2924/3025* (2013.01)

(56) References Cited

U.S. PATENT DOCUMENTS

| | | | |
|---|---|---|---|
| 2013/0265733 A1* | 10/2013 | Herbsommer | H01P 5/107 361/774 |
| 2014/0320231 A1 | 10/2014 | Seler et al. | |
| 2015/0084194 A1 | 3/2015 | Molzer et al. | |
| 2016/0293557 A1 | 10/2016 | Topak et al. | |
| 2017/0324135 A1 | 11/2017 | Blech et al. | |
| 2019/0019767 A1 | 1/2019 | Ishibashi | |
| 2019/0058241 A1 | 2/2019 | So et al. | |
| 2019/0067790 A1 | 2/2019 | Sherrer | |
| 2019/0280368 A1* | 9/2019 | Khan | H01Q 1/2283 |
| 2020/0235716 A1* | 7/2020 | Eid | H01L 23/66 |

FOREIGN PATENT DOCUMENTS

| | | |
|---|---|---|
| EP | 3364457 A1 | 8/2018 |
| WO | 2016/100267 A1 | 6/2016 |
| WO | 2018182653 A1 | 10/2018 |

\* cited by examiner

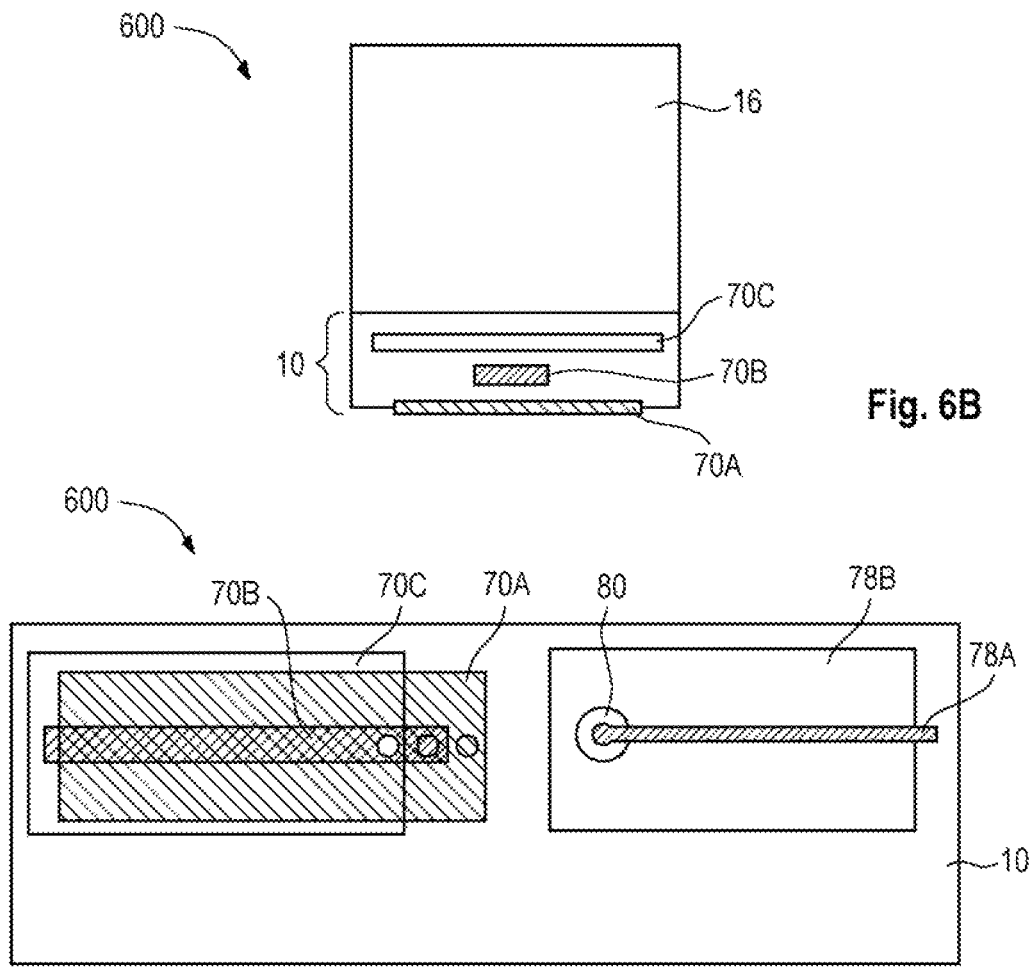
Fig. 6B
Fig. 6C
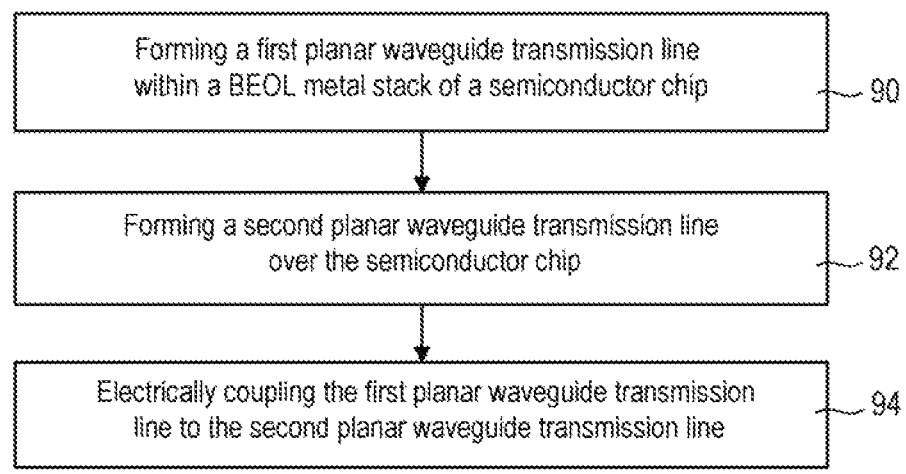
Fig. 7

SEMICONDUCTOR DEVICES COMPRISING PLANAR WAVEGUIDE TRANSMISSION LINES

CROSS REFERENCE TO RELATED APPLICATION

This application claims priority to German Patent Application No. 102019115307.7 filed on Jun. 6, 2019, the content of which is incorporated by reference herein in its entirety.

TECHNICAL FIELD

The present disclosure relates generally to semiconductor technology. For example, the disclosure relates to semiconductor devices comprising planar waveguide transmission lines and methods for producing such semiconductor devices.

BACKGROUND

In semiconductor devices, electrical connections for transmitting electrical signals are usually realized by simple metallic signal lines. By way of example, signals can be passed from a semiconductor chip of the device to an application circuit board or to some other semiconductor chip. At high signal frequencies high impedances and an attendant reduction in the quality of the signal transmission may occur in the case of the customary electrical signal-carrying arrangements.

SUMMARY

Various aspects relate to a semiconductor device. The semiconductor device comprises a first semiconductor chip. The semiconductor device furthermore comprises a first planar waveguide transmission line arranged within a BEOL metal stack of the first semiconductor chip, wherein the first planar waveguide transmission line comprises line sections situated opposite one another. The semiconductor device furthermore comprises a second planar waveguide transmission line arranged over the first semiconductor chip and electrically coupled to the first planar waveguide transmission line, wherein the second planar waveguide transmission line comprises line sections situated opposite one another.

Various aspects relate to a method for producing a semiconductor device. The method comprises forming a first planar waveguide transmission line within a BEOL metal stack of a semiconductor chip, wherein the first planar waveguide transmission line comprises line sections situated opposite one another. The method furthermore comprises forming a second planar waveguide transmission line over the semiconductor chip, wherein the second planar waveguide transmission line has line sections situated opposite one another. The method furthermore comprises electrically coupling the first planar waveguide transmission line to the second planar waveguide transmission line.

BRIEF DESCRIPTION OF THE DRAWINGS

Semiconductor devices comprising planar waveguide transmission lines and associated production methods in accordance with the disclosure are explained in greater detail below with reference to drawings. The elements shown in the drawings are not necessarily rendered in a manner true to scale relative to one another. Identical reference signs can designate identical components.

FIGS. 6A to 6C schematically show a first cross-sectional side view, a second cross-sectional side view and a plan view of a semiconductor device 600 in accordance with the disclosure.

FIG. 7 shows a flow diagram of a method for producing a semiconductor device in accordance with the disclosure.

DETAILED DESCRIPTION

In the following detailed description, reference is made to the accompanying drawings, which show for illustration purposes specific aspects and implementations in which the disclosure can be implemented in practice. In this context, direction terms such as, for example, "at the top", "at the bottom", "at the front", "at the back", etc. can be used with respect to the orientation of the figures described. Since the components of the implementations described can be positioned in different orientations, the direction terms can be used for illustration purposes and are not restrictive in any way whatsoever. Other aspects can be used and structural or logical changes can be made, without departing from the concept of the present disclosure. In other words, the following detailed description should not be understood in a restrictive sense.

Schematic views of semiconductor devices in accordance with the disclosure are described below. In this case, the semiconductor devices can be illustrated in a general way in order to describe aspects of the disclosure qualitatively. The semiconductor devices can in each case have further aspects that are not illustrated in the figures for the sake of simplicity. For example, the respective semiconductor devices can be extended by any aspects described in association with other devices in accordance with the disclosure.

Figure 1:
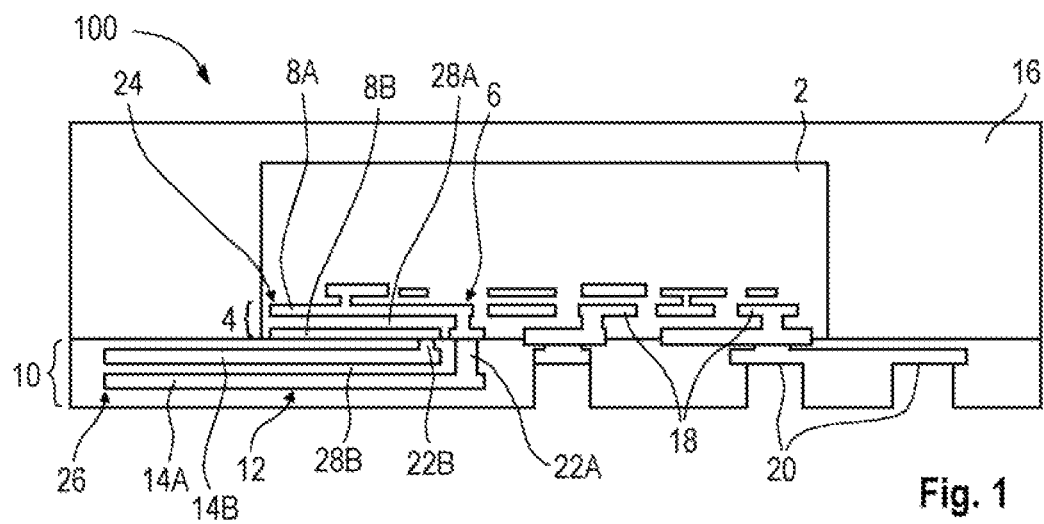
FIG. 1 schematically shows a cross-sectional side view of a semiconductor device 100 in accordance with the disclosure.

FIG. 1 schematically shows a cross-sectional side view of a semiconductor device 100 in accordance with the disclosure. The semiconductor device 100 can have a semiconductor chip 2 having a BEOL metal stack 4 or a BEOL wiring structure arranged within the semiconductor chip 2. One or a plurality of first planar waveguide transmission lines 6 can be arranged within the BEOL metal stack 4. In the example in FIG. 1, only one waveguide transmission line 6 is shown, which can have a first line section 8A and a second line section 8B situated opposite the latter. A redistribution structure 10 or redistribution wiring structure can be arranged over the underside of the semiconductor chip 2. One or a plurality of second planar waveguide transmission lines 12 can be arranged within the redistribution structure 10. In the example in FIG. 1, only one second planar waveguide transmission line 12 is shown, which can likewise have a first line section 14A and a second line section 14B situated opposite the latter.

The BEOL metal stack 4 can have further signal lines 18, which can be electrically coupled to external contacts 20 of the semiconductor device 100. The further signal lines 18 of the BEOL metal stack 4 need not necessarily be waveguide transmission lines having opposite line sections. By way of example, the further signal lines 18 can in each case have only one simple line section without a further line section situated opposite. The external contacts 20 of the semiconductor device 100 are illustrated as exposed contact locations in the example in FIG. 1. Further contact elements, such as solder deposits or solder balls, for example, can be arranged on the contact locations, the further contact elements not being illustrated in FIG. 1 for the sake of simplicity. The semiconductor chip 2 can be at least partly encapsulated by an encapsulation material 16.

The semiconductor chip 2 can operate in various frequency ranges. Accordingly, the planar waveguide transmission lines 6 and 12 electrically coupled to the semiconductor chip 2 can in each case be designed to transmit signals having frequencies in these frequency ranges. In one example, the semiconductor chip 2 can operate in a radio-frequency or microwave frequency range that can generally range from approximately 10 GHz to approximately 300 GHz. By way of example, accordingly, circuits integrated into the semiconductor chip 2 can operate in a frequency range of greater than 10 GHz and the planar waveguide transmission lines 6 and 12 can transmit signals having a frequency of greater than 10 GHz. Microwave circuits of this type can comprise for example microwave transmitters, microwave receivers, microwave transceivers, microwave sensors or microwave detectors. The devices described herein can be used for radar applications in which the frequency of the radio-frequency signal is modulated. Radar microwave devices can be used for example in automotive or industrial applications for distance determining/distance measuring systems. By way of example, automatic vehicle speed regulating systems or vehicle anticollision systems can operate in the microwave frequency range, for example in the 24 GHz, 77 GHz or 79 GHz frequency bands.

Alternatively or additionally, the semiconductor chip 2 in a further example can operate in a Bluetooth frequency range. Such a frequency range can comprise for example an ISM (Industrial, Scientific and Medical) band between approximately 2.402 GHz and approximately 2.480 GHz. Circuits integrated into the semiconductor chip 2 can accordingly operate more generally in a frequency range of greater than 1 GHz and the planar waveguide transmission lines 6 and 12 can accordingly transmit signals having a frequency of greater than 1 GHz.

In a further example, the semiconductor chip 2 can be a logic chip. By way of example, the logic chip can be part of a sensor device. In particular, the logic chip can be part of a microphone and be designed to process audio signals. Accordingly, the planar waveguide transmission lines 6 and 12 can be designed to transmit signals in the frequency ranges of the audio signals. In this case, the frequencies can be in a range of approximately 5 Hz to approximately 50 kHz, in particular of approximately 20 Hz to approximately 20 kHz.

The BEOL metal stack 4 of the semiconductor chip 2 can provide an electrical connection between an electronic active component integrated into the semiconductor chip 2 and an external terminal of the semiconductor chip 2. As a result, electrical signals can be transmitted from the semiconductor chip 2 to the external terminal and/or vice-versa. By way of example, the first waveguide transmission line 6 formed in the BEOL metal stack 4 can be electrically connected to a radio-frequency circuit of the semiconductor chip 2. For the sake of simplicity, the qualitative illustration in FIG. 1 has dispensed with an illustration of electronic active components of the semiconductor chip 2 and an electrical coupling of the components to the BEOL metal stack 4. A detailed example BEOL metal stack is shown and described in FIG. 11.

The redistribution structure (or redistribution layer) 10 can contain one or a plurality of conductor tracks in the form of metal layers or metal tracks, which can run substantially parallel to the active underside of the semiconductor chip 2. A multiplicity of dielectric layers can be arranged between the multiplicity of conductor tracks in order to electrically insulate the conductor tracks from one another. Furthermore, metal layers arranged on different planes can be electrically connected to one another by a multiplicity of through contacts (or vias). The conductor tracks of the redistribution structure 10 can fulfil the function of redistribution or redistribution wiring in order for example to electrically couple terminals of the semiconductor chip 2 to external terminals of the semiconductor device 100. In other words, the conductor tracks can be designed to make terminals of the semiconductor chip 2 available at other positions of the semiconductor device 100. Furthermore, one or a plurality of the conductor tracks or signal lines of the redistribution structure 10 can be designed to provide an electrical supply of the semiconductor chip 2.

The second planar waveguide transmission line 12 can be part of the redistribution structure 10 arranged over the semiconductor chip 2. In this case, the second planar waveguide transmission line 12 can be electrically coupled to further components, which are not shown in the qualitative illustration in FIG. 1 for the sake of simplicity. For example, the second planar waveguide transmission line 12 can be electrically coupled to a further semiconductor chip or a circuit board.

In the example in FIG. 1, the redistribution structure 10 can correspond to or comprise a redistribution layer of a semiconductor package. In a further example, the redistribution structure 10 can be or comprise a redistribution layer of a carrier substrate for the semiconductor chip 2. The semiconductor chip 2 can be arranged on a first main surface of such a carrier substrate, wherein the carrier substrate can provide a redistribution of the chip terminals from the first main surface to a second main surface situated opposite.

The first waveguide transmission line 6 and the second planar waveguide transmission line 12 can be electrically coupled to one another. In the example in FIG. 1, the planar waveguide transmission lines 6 and 12 can be connected to one another in particular by way of via connections 22A and 22B situated opposite one another. This coupling can be a metallic connection, in particular. In this case, the line sections 8A and 14A can be connected to one another by the first via connection 22A and the line sections 8B and 14B can be connected to one another by the second via connection 22B. In this case, the via connections 22A and 22B can run substantially vertically with respect to the lower main surface of the semiconductor chip 2, while the line sections of the planar waveguide transmission lines 6 and 12 can run substantially parallel to the lower main surface.

In a further example, the planar waveguide transmission lines 6 and 12 can also be electrically coupled to one another non-galvanically. In this case, a non-galvanic coupling or connection can be formed by an interruption in the (metallic) electrical connection between the planar waveguide transmission lines 6 and 12. The non-galvanic connection can form an electrical capacitance and have properties of a capacitor. A signal transmission by way of the non-galvanic connection can be effected using capacitive coupling. In one example, a non-galvanic connection can be formed at the underside of the semiconductor chip 2. As an alternative or in addition thereto, one or a plurality of non-galvanic connections can be formed in the first waveguide transmission line 6 and/or in the second planar waveguide transmission line 12. A non-galvanic connection can find application in particular in the case of a transmission of electrical signals having high frequencies, in particular having frequencies of greater than 1 GHz or greater than 10 GHz.

The first planar waveguide transmission line 6 and the second planar waveguide transmission line 12 can comprise line sections situated opposite one another continuously over an entire course from a beginning 24 of the first planar waveguide transmission line 6 as far as an end 26 of the second planar waveguide transmission line 12. The qualitative illustration in FIG. 1 does not illustrate a further electrical connection of the beginning 24 and the end 26 of the respective waveguide transmission line to further components, for the sake of simplicity. By way of example, a signal generated by a radio-frequency circuit of the semiconductor chip 2 can be coupled into the first waveguide transmission line 6 at the beginning 24. On account of the continuous course of the opposite line sections 8A, 8B and 14A, 14B, the electrical signal or the electromagnetic wave can be passed by way of the entire course of the planar waveguide transmission lines 6 and 12 as far as the end 26 of the second waveguide transmission line. The signal is transmitted from the beginning 24 as far as the end 26 completely by way of the opposite line sections of the planar waveguide transmission lines 6 and 12.

In the case of such a continuous transmission of the signals in opposite line sections of the planar waveguide transmission lines 6 and 12, impedances and signal losses associated therewith can be avoided or at least reduced. This can hold true in particular for signals in frequency ranges of greater than approximately 1 GHz or greater than approximately 10 GHz. In addition, the continuous connection contains no additional connections, such as soldered, adhesively bonded or wired interfaces, for example, in which reflections and/or other disturbances can occur in the case of high signal frequencies. The continuous signal transmission in opposite line sections of the planar waveguide transmission lines 6 and 12 in accordance with the disclosure can accordingly be superior to a signal transmission by way of simple signal lines, such as the signal lines 18, for example.

The first planar waveguide transmission line 6 and the second planar waveguide transmission line 12 can in each case correspond to or comprise at least one of the following transmission lines: a stripline, a microstrip, or a coplanar waveguide. In this case, the two planar waveguide transmission lines 6 and 12 can have in particular an identical number of metal layers or line sections which are in each case electrically coupled to one another.

In the example in FIG. 1, the planar waveguide transmission lines 6 and 12 can in each case comprise two line sections or metal layers, which can in each case be separated from one another by a dielectric material. The line sections 8A and 8B can be separated from one another by a first dielectric material 28A arranged in the BEOL metal stack 4 and the line sections 14A and 14B can be separated from one another by a second dielectric material 28B arranged in the redistribution structure 10. Here in each case one of the line sections can be a ground layer and the other line section can be a signal-carrying metal layer. In one example, the ground layer can be arranged over the signal-carrying metal layer. In a further example, this arrangement of the two layers can be interchanged. The opposite line sections of the planar waveguide transmission lines 6 and 12 can form here in particular a continuous microstrip. A qualitative and example illustration of a microstrip such as can be formed in a semiconductor device in accordance with the disclosure is shown and described in FIGS. 8A and 8B.

In a further example, the first planar waveguide transmission line 6 and the second planar waveguide transmission line 12 can in each case comprise three metal layers or line sections, separated from one another in each case by a dielectric material. Here two of the three metal layers can in each case comprise a ground layer and a third of the three metal layers can comprise a signal-carrying metal layer, wherein the signal-carrying metal layer is arranged between the ground layers. In such a case, the opposite line sections of the planar waveguide transmission lines 6 and 12 can form in particular a continuous stripline. A qualitative and example illustration of a stripline such as can be formed in a semiconductor device in accordance with the disclosure is shown and described in FIG. 9.

In yet another example, the first planar waveguide transmission line 6 and the second planar waveguide transmission line 12 can comprise metal layers or line sections which, with a dielectric material arranged therebetween, can form a continuous coplanar waveguide. A qualitative and example illustration of a coplanar waveguide such as can be formed in a semiconductor device in accordance with the disclosure is shown and described in FIG. 9.

The semiconductor chip 2 can be at least partly embedded in the encapsulation material 16. In the example in FIG. 1, the side surfaces and the top side of the semiconductor chip 2 are covered by the encapsulation material 16. In a further example, the top side of the semiconductor chip 2 can be left such that it is not covered by the encapsulation material 16. The encapsulation material 16 can protect the semiconductor chip 2 against external influences, such as moisture, for example. The encapsulation material 16 can include for example at least one from a mold compound, a laminate, an epoxy, a filled epoxy, a glass-fiber-filled epoxy, an imide, a thermoplastic, a thermosetting polymer, a polymer mixture.

The semiconductor device 100 can be a wafer level package, for example, which can be produced for example in accordance with an eWLB (embedded Wafer Level Ball Grid Array) method. In this case, the undersides of the semiconductor chip 2 and of the encapsulation material 16 can lie in a common plane, e.g. be arranged coplanar, on account of the production process. In one example, the semiconductor device 100 can be a fan-out package, in which the external terminals of the semiconductor device 100 can be arranged outside a contour of the semiconductor chip 2. In a further example, the semiconductor device can be a fan-in package, in which (all) external terminals can be arranged within the contour of the semiconductor chip 2.

Figure 2:
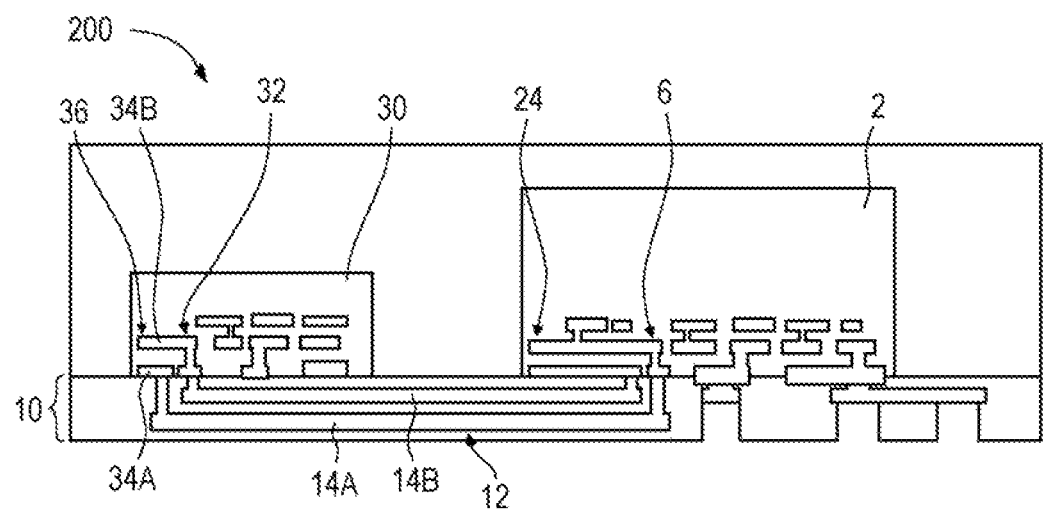
FIG. 2 schematically shows a cross-sectional side view of a semiconductor device 200 in accordance with the disclosure.

FIG. 2 schematically shows a cross-sectional side view of a semiconductor device 200 in accordance with the disclosure. The semiconductor device 200 can be at least partly similar to the semiconductor device 100 from FIG. 1 and have identical components, and so explanations concerning FIG. 1 can also apply to FIG. 2.

The semiconductor device 200 can have an additional, second semiconductor chip 30 having a third planar waveguide transmission line 32. The third planar waveguide transmission line 32 can be formed in a BEOL metal stack of the second semiconductor chip 30 and can be electrically coupled to the second planar waveguide transmission line 12. The electrical coupling between the second planar waveguide transmission line 12 and the third planar waveguide transmission line 32 can be similar to the above-described electrical coupling between the first planar waveguide transmission line 6 and the second planar waveguide transmission line 12. Only two semiconductor chips 2 and 30 are shown in the example in FIG. 2. In further examples, semiconductor devices in accordance with the disclosure can also have any desired number of more than two semiconductor chips, which can be coupled to one another by way of planar waveguide transmission lines.

The three planar waveguide transmission lines 6, 12 and 32 can have line sections situated opposite one another continuously over an entire course from a beginning 24 of the first planar waveguide transmission line 6 as far as an end 36 of the third planar waveguide transmission line 32. On account of this continuous course of the opposite line sections, an electrical signal or an electromagnetic wave can be passed by way of the entire course of the three planar waveguide transmission lines 6, 12 and 32 between the respectively opposite line sections. As already mentioned above, one of the respective two opposite line sections can be a ground layer and the other line section can be a signal-carrying layer. In the example in FIG. 2, the line section 14A can be the signal-carrying metal layer and the line section 14B can be the ground layer. The arrangement of the ground layer between the signal-carrying metal layer and the semiconductor chips 2 and 30 makes it possible to provide a shielding of the semiconductor chips 2 and 30 vis à vis the signal-carrying metal layer.

In one example, both semiconductor chips 2 and 30 can be designed to process signals in a frequency range of greater than 1 GHz. In an analogous manner, the three planar waveguide transmission lines 6, 12 and 36 can in each case be designed to transmit signals in this frequency range between the first semiconductor chip 2 and the second semiconductor chip 30. In this case, each of the two semiconductor chips 2 and 30 can have one or a plurality of radio-frequency circuits for generating and processing radio-frequency signals. As an alternative or in addition thereto, at least one of the two semiconductor chips 2 and 30 can have an antenna structure.

In a further example, the first semiconductor chip 2 can comprise at least one from an RF transmitting circuit or an RF receiver circuit. Furthermore, the second semiconductor chip 30 can comprise a local oscillator (LO) circuit designed to provide a local oscillator signal to the first semiconductor chip 2. By way of example, the semiconductor device 200 can be a radar device such as is used in the automotive sector for recognizing and differentiating different objects. Such a radar device can have a plurality of radar transceivers in a cascade circuit. In the case of such a cascade circuit, it may be desirable for all the transceivers to use an identical, as far as possible phase-synchronous, radio-frequency local oscillator signal in order for example to down-convert received radar signals to the baseband. In this context, the first semiconductor chip 2 can be an LO circuit, which makes a radio-frequency LO signal available to a transceiver circuit of the second semiconductor chip 30 and to further transceiver circuits (not shown). In this case, the first semiconductor chip 2 constitutes an LO master and the transceiver circuits constitute LO slaves.

In a further example, the first semiconductor chip 2 can comprise a sensor chip and the second semiconductor chip 30 can comprise a logic semiconductor chip. The second planar waveguide transmission line 12 can be designed to transmit sensor signals between the sensor chip and the logic semiconductor chip. The sensor chip can contain a microphone, for example, which converts acoustic signals into electrical signals that are then transmitted by way of the second planar waveguide transmission line 12 to the logic semiconductor chip for further processing. The frequencies of the transmitted signals can be in a range of approximately 5 Hz to approximately 50 kHz, in particular of approximately 20 Hz to approximately 20 kHz.

Figure 3:
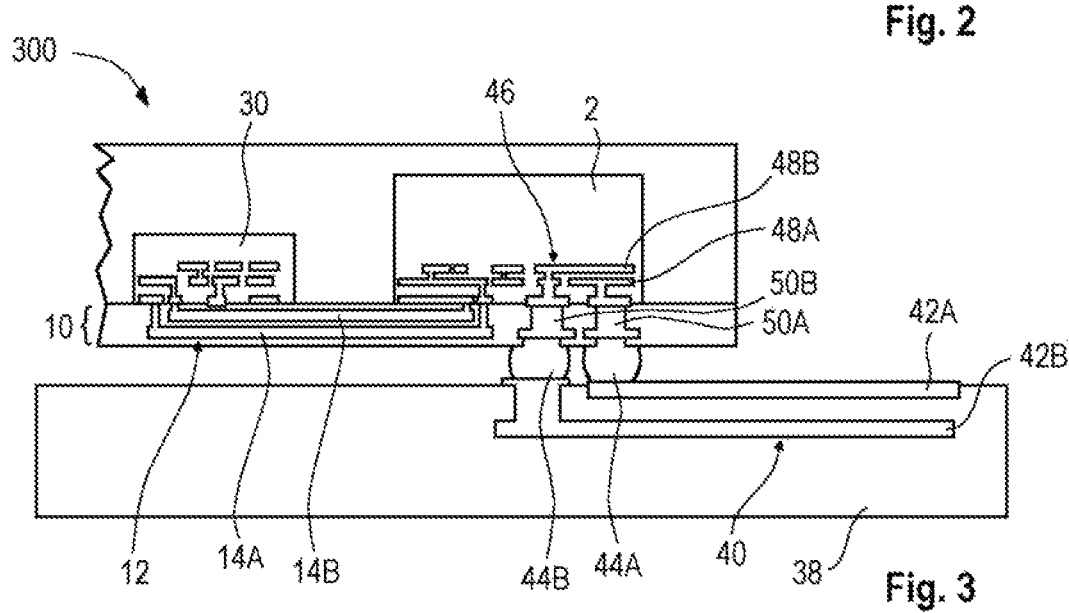
FIG. 3 schematically shows a cross-sectional side view of a semiconductor device 300 in accordance with the disclosure.

FIG. 3 schematically shows a cross-sectional side view of a semiconductor device 300 in accordance with the disclosure. The semiconductor device 300 can be at least partly similar to the semiconductor devices described above and have identical components.

The semiconductor device 300 can have a circuit board 38 having one or a plurality of planar waveguide transmission lines 40 arranged therein. The planar waveguide transmission line 40 can include line sections 42A and 42B situated opposite one another and can be similar to the planar waveguide transmission lines already described. The planar waveguide transmission line 40 can be electrically coupled to a planar waveguide transmission line 46 of the semiconductor chip 2 by way of connecting elements 44A and 44B and the redistribution structure 10. Analogously to the waveguide transmission lines already described, the planar waveguide transmission line 46 of the semiconductor chip 2 can have line sections 48A and 48B situated opposite one another. By way of example, the planar waveguide transmission line 46 can be connected to a radio-frequency circuit (not shown) of the semiconductor chip 2, such that electrical signals can be transmitted from the circuit board 38 to the radio-frequency circuit and/or vice-versa.

In the example in FIG. 3, the planar waveguide transmission line 40 of the circuit board 38 is electrically coupled to the planar waveguide transmission line 46 of the semiconductor chip 2 by way of the connecting elements 44A and 44B and two through contacts 50A and 50B. In a further example, an electrical connection of the semiconductor chip 2 to the circuit board 38 can also be effected by way of the second planar waveguide transmission line 12. In the example in FIG. 3, the line section 14A can be a ground layer and the line section 14B can be a signal-carrying metal layer. The arrangement of the ground layer between the signal-carrying metal layer and the circuit board 38 makes it possible to provide a shielding of the circuit board 38 vis à vis the signal-carrying metal layer.

Figure 4:
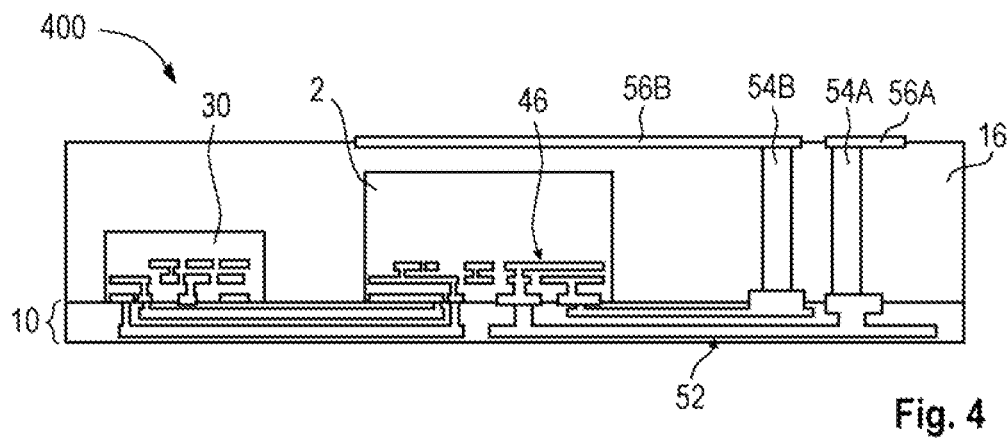
FIG. 4 schematically shows a cross-sectional side view of a semiconductor device 400 in accordance with the disclosure.

FIG. 4 schematically shows a cross-sectional side view of a semiconductor device 400 in accordance with the disclosure. The semiconductor device 400 can be at least partly similar to the semiconductor devices described above and have identical components.

In the example in FIG. 4, the encapsulation material 16 can have through contacts 54A and 54B running from its underside to its top side. In one example, the through contacts 54A and 54B may have been formed by at least one from drilling, laser drilling, etching, etc. In a further example, the through contacts 54A and 54B can be part of a prefabricated insert that has been embedded into the encapsulation material 16. The through contacts 54A and 54B can be electrically connected respectively to metal layers 56A and 56B arranged on the top side of the encapsulation material 16. On their underside the through contacts 54A and 54B can be connected to a waveguide transmission line 52 arranged in the redistribution structure 10.

The metal layers 56A and 56B can be electrically coupled to electronic structures of the semiconductor chip 2 by way of the through contacts 54A, 54B and the waveguide transmission lines 46 and 52. In one example, the metal layers 56A and 56B can form an electronic structure, such as an antenna, for example. Radio-frequency signals generated by a radio-frequency circuit of the semiconductor chip 2 can be transmitted to the antenna by way of the waveguide transmission lines 46 and 52 and vice-versa. In a further example, the metal layers 56A and 56B can form a part of or be electrically connected to a further redistribution layer (not shown). In yet another example, the metal layers 56A and 56B can produce an electrical connection to a further semiconductor device (not shown), which can be stacked over the semiconductor device 400. Such a stacked arrangement can be a package-on-package device, for example.

Figure 5:
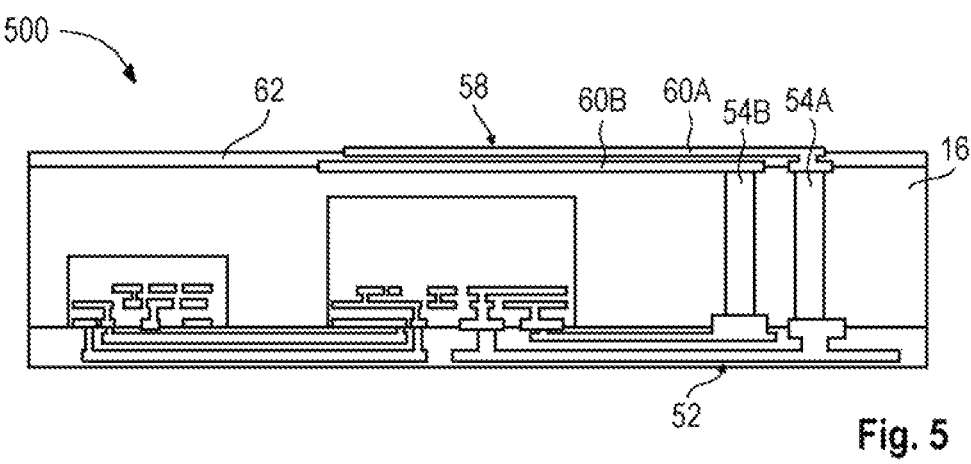
FIG. 5 schematically shows a cross-sectional side view of a semiconductor device 500 in accordance with the disclosure.

FIG. 5 schematically shows a cross-sectional side view of a semiconductor device 500 in accordance with the disclosure. The semiconductor device 500 can be at least partly similar to the semiconductor device 400 from FIG. 4 and have identical components.

In comparison with FIG. 4, the through contacts 54A and 54B can be electrically coupled to a further waveguide transmission line 58 arranged on the top side of the encapsulation material 16. The waveguide transmission line 58 can have two line sections 60A and 60B situated opposite one another, which can be separated from one another by a dielectric material 62. The waveguide transmission line 58 can have for example the same functions as the metal layers 56A and 56B in FIG. 4.

Figure 6A:
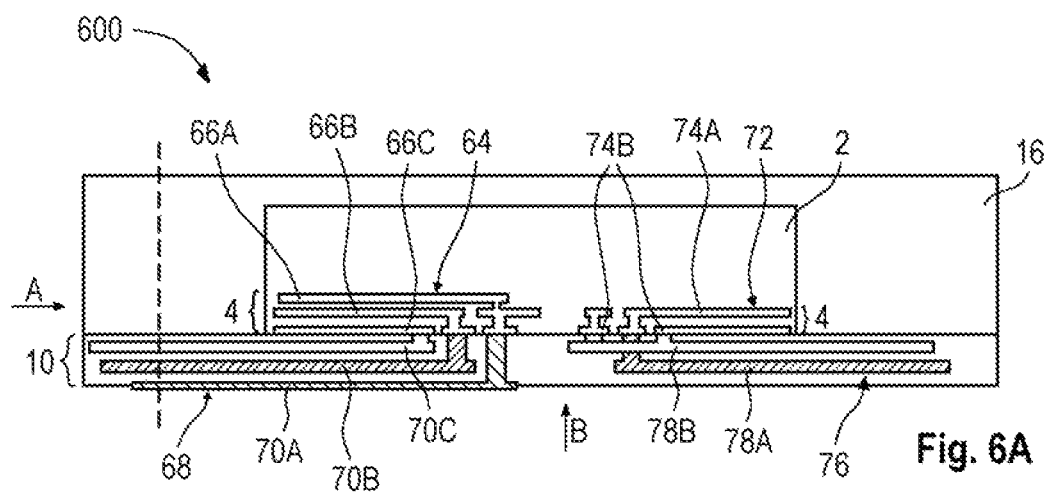

FIGS. 6A to 6C schematically show various views of a semiconductor device 600 in accordance with the disclosure. FIG. 6A schematically shows a first cross-sectional side view of the semiconductor device 600. FIG. 6B shows a second cross-sectional side view of the semiconductor device 600 on the basis of a sectional plane (cf. dashed line in FIG. 6A) and a viewing direction A (cf. arrow in FIG. 6A). FIG. 6C schematically shows a plan view of the semiconductor device 600 in a viewing direction B (cf. arrow in FIG. 6A). In this case, for illustration reasons, FIG. 6C shows components which may possibly be at least partly concealed in a real view. The semiconductor device 600 can be at least partly similar to the semiconductor devices described above and have identical components.

The semiconductor device 600 can have a semiconductor chip 2 having one or a plurality of BEOL metal stacks 4. The semiconductor chip 2 can be at least partly embedded into an encapsulation material 16. A redistribution structure 10 can be arranged on the undersides of the semiconductor chip 2 and of the encapsulation material 16. A first planar waveguide transmission line 64 having three line sections 66A to 66C situated opposite one another can be arranged within the BEOL metal stack 4. In an analogous manner, a second planar waveguide transmission line 68 having three line sections 70A to 70C situated opposite one another can be arranged in the redistribution structure 10. The first planar waveguide transmission line 64 can be electrically coupled to the second planar waveguide transmission line 68 by way of through contacts situated opposite one another.

In the example in FIGS. 6A-6C, the respective three line sections of the first planar waveguide transmission line 64 and of the second planar waveguide transmission line 68 can be formed by metal layers separated from one another by a dielectric material. Here in each case two of the three metal layers can comprise a ground layer and the third of the three metal layers can comprise a signal-carrying metal layer situated therebetween. By way of example, therefore, the line sections 70A to 70C can be ground layers and the line section 70B can be a signal-carrying metal layer. The first and second planar waveguide transmission lines 64 and 68 can form in particular a continuous stripline as described by way of example in FIG. 9. It is evident from the cross-sectional side view in FIG. 6B that the ground layers can have a larger width than the signal-carrying layer.

Furthermore, a third planar waveguide transmission line 72 having line sections 74A and 74B situated opposite one another can be formed within the BEOL metal stack 4. In an analogous manner, a fourth planar waveguide transmission line 76 having line sections 78A and 78B situated opposite one another can be arranged in the redistribution structure 10. The third planar waveguide transmission line 72 can be electrically coupled to the fourth planar waveguide transmission line 76 by way of through contacts situated opposite one another. The respective two line sections of the third and fourth planar waveguide transmission lines 72 and 76 can be formed by metal layers separated from one another by a dielectric material. Here in each case one of the two metal layers can comprise a ground layer and the other metal layer can comprise a signal-carrying metal layer. In the example in FIGS. 6A-6C, the line sections 74A and 78A can correspond in each case to signal-carrying metal layers, wile the line sections 74B and 78B can correspond to ground layers.

The ground layer 78B can have an opening 80, which is illustrated as circular by way of example in the plan view in FIG. 6C. In further examples, the opening 80 can also have a different shape, for example rectangular or elliptic. The signal-carrying layer 78A can run at least partly through the opening 80 of the ground layer 78B. At the position of the opening 80, the planar waveguide transmission line 76 can thus form a coaxial structure in which the signal-carrying layer 78A can be shielded against possible interference radiation at least at the location of the opening 80 through the ground layer 78B. In the example side view in FIG. 6A, in particular a vertical section of the signal-carrying layer 78A can run through the horizontally oriented opening 80 of the ground layer 78B. In further examples, the opening 80 can also be formed such that the signal-carrying layer 78A runs through or is shielded by the opening 80 over a longer section.

FIG. 7 shows a flow diagram of a method for producing a semiconductor device in accordance with the disclosure. The method can be used to produce one of the semiconductor devices described above.

90 involves forming a first planar waveguide transmission line within a BEOL metal stack of a semiconductor chip, wherein the first planar waveguide transmission line has line sections situated opposite one another. 92 involves forming a second planar waveguide transmission line over the semiconductor chip, wherein the second planar waveguide transmission line has line sections situated opposite one another. 94 involves electrically coupling the first planar waveguide transmission line to the second planar waveguide transmission line.

In the method in FIG. 7, forming the second planar waveguide transmission line can be carried out in particular during a process of forming a redistribution layer of a semiconductor package. In this case, conductor tracks of the redistribution layer can be produced for example by sputtering, electroless deposition and/or vapor phase deposition. Dielectric layers of the redistribution layer can for example be deposited from a vapor phase and/or a solution and/or be laminated. The components of the redistribution layer can be structured for example using photolithographic processes, etching processes and/or laser drilling. In the case of a second planar waveguide transmission line fabricated in this way, a distance between directly adjacent metal layers or line sections of the second planar waveguide transmission line can be in a range of approximately 2 micrometers to approximately 20 micrometers.

Figure 8A:
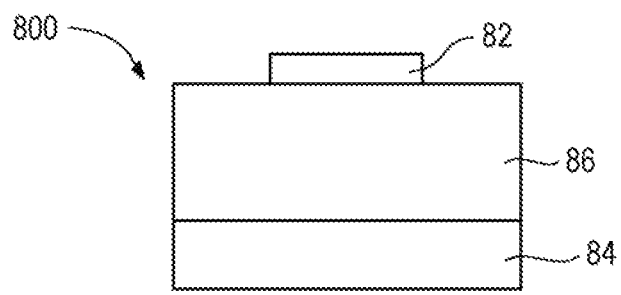
FIGS. 8A and 8B schematically show a cross-sectional side view and a perspective view of a microstrip 800.
Figure 8B:
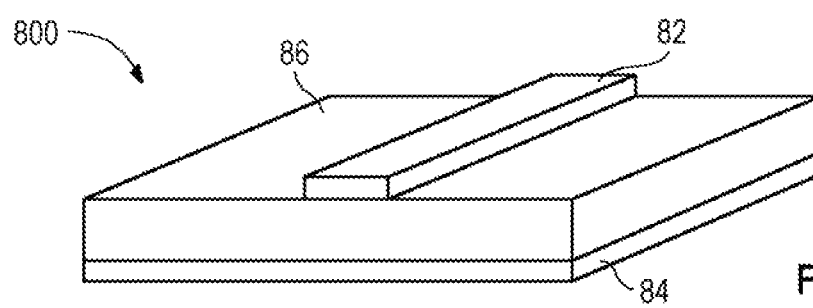

FIGS. 8A and 8B schematically show a cross-sectional side view and a perspective view of a microstrip 800 such as can be contained in a semiconductor device in accordance with the disclosure. The microstrip 800 can be regarded as one example form of a planar waveguide transmission line. The microstrip 800 can comprise a first electrically conductive layer 82, a second electrically conductive layer 84 and a dielectric substrate 86 separating these layers. The first electrically conductive layers 82 and 84 can be fabricated from a metal and/or a metal alloy, for example. The first electrically conductive layer 82 can be a signal-carrying layer, while the second electrically conductive layer 84 can have the function of a ground layer. In this case, the ground layer can have a larger width than the signal-carrying layer. An electrical signal or an electromagnetic wave can propagate in the interspace between the signal-carrying layer 82 and the ground layer 84. In this case, electric field lines can also enter the space over the signal-carrying layer 82. The transmission of an electromagnetic wave by way of the microstrip 800 can correspond to a quasi-TEM (Transverse Electromagnetic Mode) transmission.

Figure 9:
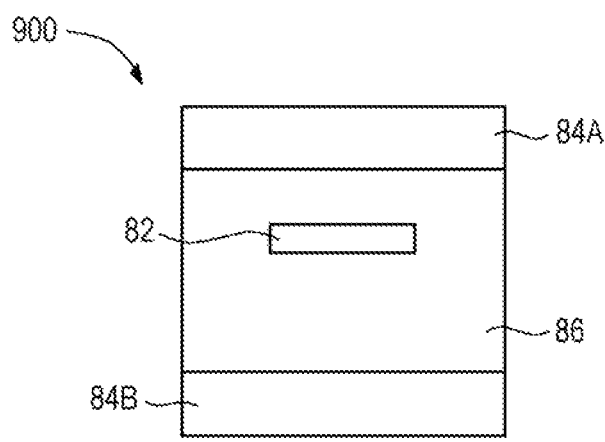
FIG. 9 schematically shows a cross-sectional side view of a stripline 900.

FIG. 9 schematically shows a cross-sectional side view of a stripline 900 such as can be contained in a semiconductor device in accordance with the disclosure. A perspective view of the stripline 900 can be similar to FIG. 8B. The stripline 900 can be regarded as one example form of a planar waveguide transmission line. The stripline 900 can comprise a first electrically conductive layer 82, a second electrically conductive layer 84A, a third electrically conductive layer 84B and a dielectric substrate 86. The first electrically conductive layer 82 can be a signal-carrying layer, while the second and third electrically conductive layers 84A and 84B can have in each case the function of a ground layer. The dielectric substrate 86 can be arranged between the ground layers 84A, 84B and embed the signal-carrying layer 82. In the example in FIG. 9, the signal-carrying layer 82 is arranged closer to the upper ground layer 84A. In a further example, the signal-carrying layer 82 can be arranged closer to the lower ground layer 84B. In yet another example, the signal-carrying layer 82 can be spaced apart equally from the lower and upper ground layers 84A, 84B. The electrically conductive layers of the stripline 900 can be fabricated from a metal and/or a metal alloy, for example. An electrical signal or an electromagnetic wave can propagate in the interspace between the signal-carrying layer 82 and the two ground layers 84A and 84B. The electric field lines can be delimited upward and downward by the ground layers 84A and 84B, respectively, and may not necessarily enter the space thereabove and therebelow, respectively. The transmission of an electromagnetic wave by way of the stripline 900 can correspond to a substantially pure TEM transmission.

Figure 10:
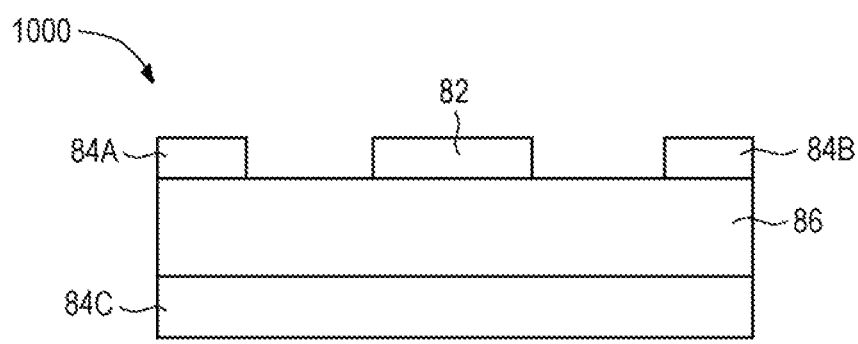
FIG. 10 schematically shows a cross-sectional side view of a coplanar waveguide 1000.

FIG. 10 schematically shows a cross-sectional side view of a coplanar waveguide 1000 such as can be contained in a semiconductor device in accordance with the disclosure. A perspective view of the coplanar waveguide 1000 can be similar to FIG. 8A. The coplanar waveguide 1000 can be regarded as one example form of a planar waveguide transmission line. The coplanar waveguide 1000 can comprise a first electrically conductive layer 82, a second electrically conductive layer 84A, a third electrically conductive layer 84B, a fourth electrically conductive layer 84C and a dielectric substrate 86. The electrically conductive layers of the coplanar waveguide 1000 can be fabricated from a metal and/or a metal alloy, for example. The first electrically conductive layer 82 can be a signal-carrying layer, while the remaining three electrically conductive layers 84A to 84C can have the function of ground layers. The electrically conductive layers 82, 84A and 84B can be arranged (coplanar) on the top side of the dielectric substrate 86 and be separated from one another by gaps. The ground layers 84A and 84B can accordingly form a ground plane interrupted by the signal-carrying layer 82. The upper and lower ground planes can be electrically connected to one another by way of through contacts (not shown). The transmission of an electromagnetic wave by way of the coplanar waveguide 1000 can correspond to a quasi-TEM transmission.

Figure 11:
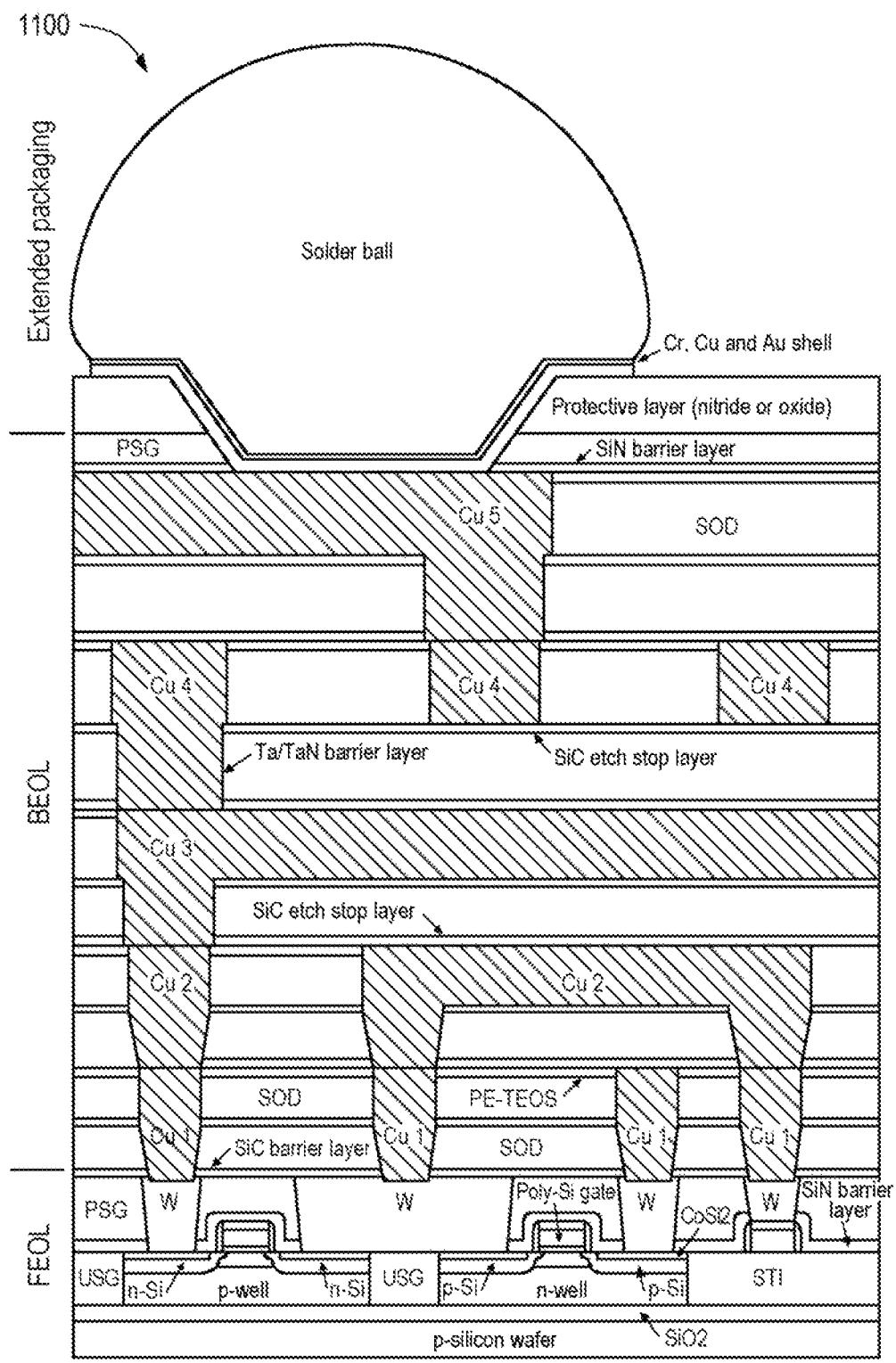
FIG. 11 schematically shows an excerpt from a cross-sectional side view of a semiconductor device 1100 in accordance with the disclosure comprising a BEOL (Back End Of Line) metal stack.

FIG. 11 schematically shows an excerpt from a cross-sectional side view of a semiconductor device 1100 in accordance with the disclosure. The semiconductor device 1100 comprises components which were formed by FEOL (Front End Of Line) processes (cf. lower region "FEOL"). Furthermore, the semiconductor device 1100 comprises components that were formed by BEOL (Back End Of Line) processes (cf. middle region "BEOL"). The FEOL region and the BEOL region can already form a semiconductor chip. The semiconductor device 1100 furthermore comprises components that were formed by further production processes (cf. upper region "extended packaging"). The following abbreviations are used in FIG. 11: PSG ("phosphosilicate glass"), SOD ("spin-on dielectric"), PE-TEOS ("plasma-enhanced tetraethyl orthosilicate"), USG ("undoped silicate glass"), STI ("shallow trench isolation").

In the FEOL region, the semiconductor device 1100 can have one or a plurality of electronic active components integrated into the semiconductor material or a semiconductor chip of the semiconductor device 1100. In the example in FIG. 11, a transistor is illustrated as electronic active components. In the BEOL region, the semiconductor device 1100 can have a BEOL metal stack or a BEOL wiring structure. The wiring structure can contain a plurality of metal layers Cu1 to Cu5, which can be insulated from one another by a plurality of dielectric layers SOD. In FIG. 11, the metal layers Cu1 to Cu5 can be fabricated from copper, for example. The top side of the BEOL wiring structure can be passivated by at least one from the following: an SiN layer, a PSG layer, a protective layer composed of nitride and/or oxide.

The topmost metal layer Cu5 of the BEOL wiring structure can be electrically connected to an external contact element by way of one or a plurality of electrically conductive layers. In the example in FIG. 11, the external contact element can be a solder ball. On its underside the BEOL wiring structure can be electrically connected to the transistor of the FEOL region by way of W (tungsten) layers. To summarize, the BEOL wiring structure can accordingly provide an electrical connection between an electronic active component integrated into the semiconductor chip and an external terminal of the first semiconductor chip. Such an electrical connection can be designed to drive the semiconductor chip using electrical signals from outside the semiconductor device 1100 and/or to transmit a signal generated in the semiconductor chip to the external terminal.

EXAMPLES

Semiconductor devices comprising planar waveguide transmission lines and associated production methods are explained below on the basis of examples.

Example 1 is a semiconductor device, comprising: a first semiconductor chip; a first planar waveguide transmission line arranged within a BEOL metal stack of the first semiconductor chip, wherein the first planar waveguide transmission line comprises line sections situated opposite one another; and a second planar waveguide transmission line arranged over the first semiconductor chip and electrically coupled to the first planar waveguide transmission line, wherein the second planar waveguide transmission line comprises line sections situated opposite one another.

Example 2 is a semiconductor device according to example 1, wherein the first planar waveguide transmission line and the second planar waveguide transmission line are electrically coupled to one another by via connections situated opposite one another.

Example 3 is a semiconductor device according to example 1 or 2, wherein the first planar waveguide transmission line and the second planar waveguide transmission line comprise line sections situated opposite one another continuously over an entire course from a beginning of the first planar waveguide transmission line to an end of the second planar waveguide transmission line.

Example 4 is a semiconductor device according to any of the preceding examples, wherein the first planar waveguide transmission line and the second planar waveguide transmission line in each case comprise at least one of the following transmission lines: a stripline, a microstrip, or a coplanar waveguide.

Example 5 is a semiconductor device according to any of the preceding examples, wherein the first planar waveguide transmission line is part of a BEOL wiring structure arranged within the first semiconductor chip, wherein the BEOL wiring structure provides an electrical connection between an electronic active component integrated into the first semiconductor chip and an external terminal of the first semiconductor chip in order to transmit a signal generated in the first semiconductor chip.

Example 6 is a semiconductor device according to any of the preceding examples, wherein the second planar waveguide transmission line is part of a redistribution structure arranged over the first semiconductor chip.

Example 7 is a semiconductor device according to example 6, wherein the redistribution structure comprises at least one from a redistribution layer of a semiconductor package or a redistribution layer of a carrier substrate for the semiconductor chip.

Example 8 is a semiconductor device according to any of the preceding examples, wherein the first planar waveguide transmission line and the second planar waveguide transmission line are in each case designed to transmit signals having a frequency of greater than 1 GHz.

Example 9 is a semiconductor device according to any of the preceding examples, wherein: the first planar waveguide transmission line and the second planar waveguide transmission line in each case comprise two metal layers separated from one another by a dielectric material, and a first of the two metal layers comprises a ground layer and a second of the two metal layers comprises a signal-carrying metal layer.

Example 10 is a semiconductor device according to any of examples 1 to 8, wherein: the first planar waveguide transmission line and the second planar waveguide transmission line in each comprise three metal layers separated from one another by a dielectric material, and two of the three metal layers in each case comprise a ground layer and a third of the three metal layers comprises a signal-carrying metal layer, wherein the signal-carrying metal layer is arranged between the ground layers.

Example 11 is a semiconductor device according to any of the preceding examples, wherein: the second planar waveguide transmission line comprises a ground layer and a signal-carrying metal layer, the ground layer comprises an opening, and the signal-carrying metal layer runs at least partly through the opening of the ground layer.

Example 12 is a semiconductor device according to any of the preceding examples, wherein a distance between directly adjacent metal layers of the second planar waveguide transmission line is in a range of 2 micrometers to 20 micrometers.

Example 13 is a semiconductor device according to any of the preceding examples, furthermore comprising: a second semiconductor chip, comprising a third planar waveguide transmission line arranged within the second semiconductor chip, wherein the third planar waveguide transmission line is electrically coupled to the second planar waveguide transmission line.

Example 14 is a semiconductor device according to example 13, wherein the first semiconductor chip and the second semiconductor chip are in each case designed to process signals in a frequency range of greater than 1 GHz, wherein the second planar waveguide transmission line is designed to transmit signals in a frequency range of greater than 1 GHz between the first semiconductor chip and the second semiconductor chip.

Example 15 is a semiconductor device according to example 13, wherein: the first semiconductor chip comprises at least one from an RF transmitting circuit or an RF receiver circuit, and the second semiconductor chip comprises a local oscillator circuit designed to provide a local oscillator signal to the first semiconductor chip.

Example 16 is a semiconductor device according to example 13, wherein the first semiconductor chip comprises a sensor chip and the second semiconductor chip comprises a logic semiconductor chip, wherein the second planar waveguide transmission line is designed to transmit sensor signals between the sensor chip and the logic semiconductor chip.

Example 17 is a semiconductor device according to any of the preceding examples, furthermore comprising: a circuit board, comprising a further planar waveguide transmission line arranged within the circuit board, wherein the further planar waveguide transmission line is electrically coupled to the second planar waveguide transmission line.

Example 18 is a semiconductor device according to example 17, wherein a ground layer of the second planar waveguide transmission line is arranged between the circuit board and a signal-carrying metal layer of the second planar waveguide transmission line.

Example 19 is a semiconductor device according to any of the preceding examples, furthermore comprising: an encapsulation material, wherein the first semiconductor chip is at least partly encapsulated by the encapsulation material; and through contacts running from a first surface of the encapsulation material to an opposite second surface of the encapsulation material, the through contacts being electrically coupled to the second planar waveguide transmission line.

Example 20 is a semiconductor device according to example 19, furthermore comprising: a further planar waveguide transmission line arranged over the encapsulation material and electrically coupled to the through contacts.

Example 21 is a method for producing a semiconductor device, wherein the method comprises: forming a first planar waveguide transmission line within a BEOL metal stack of a semiconductor chip, wherein the first planar waveguide transmission line has line sections situated opposite one another; forming a second planar waveguide transmission line over the semiconductor chip, wherein the second planar waveguide transmission line has line sections situated opposite one another; and electrically coupling the first planar waveguide transmission line to the second planar waveguide transmission line.

Example 22 is a method according to example 21, wherein forming the second planar waveguide transmission line is carried out during a process of forming a redistribution layer of a semiconductor package.

Within the meaning of the present description, the terms "connected", "coupled", "electrically connected" and/or "electrically coupled" need not necessarily mean that components must be directly connected or coupled to one another. Intervening components can be present between the "connected", "coupled", "electrically connected" or "electrically coupled" components.

Furthermore, the words "over" and "on" used for example with respect to a material layer that is formed "over" or "on" a surface of an object or is situated "over" or "on" the surface can be used in the present description in the sense that the material layer is arranged (for example formed, deposited, etc.) "directly on", for example in direct contact with, the surface meant. The words "over" and "on" used for example with respect to a material layer that is formed or arranged "over" or "on" a surface can also be used in the present text in the sense that the material layer is arranged (e.g. formed, deposited, etc.) "indirectly on" the surface meant, wherein for example one or more additional layers are situated between the surface meant and the material layer.

Insofar as the terms "have", "contain", "encompass", "with" or variants thereof are used either in the detailed description or in the claims, these terms are intended to be inclusive in a similar manner to the term "comprise". That means that within the meaning of the present description the terms "have", "contain", "encompass", "with", "comprise" and the like are open terms which indicate the presence of stated elements or features but do not exclude further elements or features. The articles "a/an" or "the" should be understood such that they include the plural meaning and also the singular meaning, unless the context clearly suggests a different understanding.

Furthermore, the word "example" is used in the present text in the sense that it serves as an example, a case or an illustration. An aspect or a design that is described as "example" in the present text should not necessarily be understood in the sense as though it has advantages over other aspects or designs. Rather, the use of the word "example" is intended to present concepts in a concrete manner. Within the meaning of this application, the term "or" does not mean an exclusive "or", but rather an inclusive "or". That is to say that, unless indicated otherwise or unless a different interpretation is allowed by the context, "X uses A or B" means each of the natural inclusive permutations. That is to say if X uses A, X uses B or X uses both A and B, then "X uses A or B" is fulfilled in each of the cases mentioned above. Moreover, the articles "a/an" can be interpreted within the meaning of this application and the accompanying claims generally as "one or more", unless it is expressly stated or clearly evident from the context that only a singular is meant. Furthermore, at least one from A and B or the like generally means A or B or both A and B.

Devices and methods for producing devices are described in the present description. Observations made in connection with a device described can also apply to a corresponding method, and vice versa. If a specific component of a device is described, for example, then a corresponding method for producing the device can contain an action for providing the component in a suitable manner, even if such an action is not explicitly described or illustrated in the figures. Moreover, the features of the various example aspects described in the present text can be combined with one another, unless expressly noted otherwise.

Although the disclosure has been shown and described with respect to one or more implementations, equivalent alterations and modifications based at least in part on the reading and understanding of this description and the accompanying drawings will be apparent to the person skilled in the art. The disclosure includes all such modifications and alterations and is restricted solely by the concept of the following claims. Especially with respect to the various functions that are implemented by the above-described components (for example elements, resources, etc.), the intention is that, unless indicated otherwise, the terms used for describing such components correspond to any components which implement the specified function of the described component (which is functionally equivalent, for example), even if it is not structurally equivalent to the disclosed structure which implements the function of the example implementations of the disclosure as presented herein. Furthermore, even if a specific feature of the disclosure has been disclosed with respect to only one of various implementations, such a feature can be combined with one or more other features of the other implementations in a manner such as is desired and advantageous for a given or specific application.

The invention claimed is:

1. A semiconductor device, comprising:
   a first semiconductor chip;
   a first planar waveguide transmission line arranged within a Back End of Line (BEOL) metal stack of the first semiconductor chip; and
   a second planar waveguide transmission line arranged over the first semiconductor chip and physically and electrically coupled to the first planar waveguide transmission line via one or more metallic connections,
      wherein the first planar waveguide transmission line and the second planar waveguide transmission line each comprise line sections situated opposite one another continuously over an entire course from a beginning of the first planar waveguide transmission line to an end of the second planar waveguide transmission line,
      wherein the second planar waveguide transmission line is part of a redistribution structure arranged above the first semiconductor chip, and
      wherein the redistribution structure comprises a redistribution layer of a semiconductor package.

2. The semiconductor device as claimed in claim 1, wherein the one or more metallic connections comprise via connections situated opposite one another.

3. The semiconductor device as claimed in claim 1, wherein the first planar waveguide transmission line and the second planar waveguide transmission line each comprise at least one of: a stripline, a microstrip, or a coplanar waveguide.

4. The semiconductor device as claimed in claim 1, wherein the first planar waveguide transmission line is part of a BEOL wiring structure arranged within the first semiconductor chip, and
wherein the BEOL wiring structure provides an electrical connection between an electronic active component integrated into the first semiconductor chip and an external terminal of the first semiconductor chip to transmit a signal generated in the first semiconductor chip.

5. The semiconductor device as claimed in claim 1, wherein the redistribution structure comprises a redistribution layer of a carrier substrate for the first semiconductor chip.

6. The semiconductor device as claimed in claim 1, wherein the first planar waveguide transmission line and the second planar waveguide transmission line are each configured to transmit signals having a frequency of greater than 1 GHz.

7. The semiconductor device as claimed in claim 1, wherein the first planar waveguide transmission line and the second planar waveguide transmission line each comprise two metal layers separated from one another by a dielectric material, and
wherein a first of the two metal layers comprises a ground layer and a second of the two metal layers comprises a signal-carrying metal layer.

8. The semiconductor device as claimed in claim 1, wherein a distance between directly adjacent metal layers of the second planar waveguide transmission line is in a range of 2 micrometers to 20 micrometers.

9. The semiconductor device as claimed in claim 1, further comprising:
a third planar waveguide transmission line arranged within a second semiconductor chip, wherein the third planar waveguide transmission line is electrically coupled to the second planar waveguide transmission line.

10. The semiconductor device as claimed in claim 9, wherein the first semiconductor chip comprises at least one of an RF transmitting circuit or an RF receiver circuit, and wherein the second semiconductor chip comprises a local oscillator circuit configured to provide a local oscillator signal to the first semiconductor chip.

11. A method for producing a semiconductor device, wherein the method comprises:
forming a first planar waveguide transmission line within a Back End of Line (BEOL) metal stack of a semiconductor chip;
forming a second planar waveguide transmission line over the semiconductor chip,
wherein the first planar waveguide transmission line and the second planar waveguide transmission line each comprise line sections situated opposite one another continuously over an entire course from a beginning of the first planar waveguide transmission line to an end of the second planar waveguide transmission line, and
wherein forming the second planar waveguide transmission line is carried out during a process of forming a redistribution layer of a semiconductor package; and
physically and electrically coupling the first planar waveguide transmission line to the second planar waveguide transmission line via one or more metallic connections.

12. The method of claim 11, wherein the one or more metallic connections comprise via connections situated opposite one another.

13. The method of claim 11, wherein the first planar waveguide transmission line and the second planar waveguide transmission line each comprise at least one of: a stripline, a microstrip, or a coplanar waveguide.

14. The method of claim 11, wherein the first planar waveguide transmission line is part of a BEOL wiring structure arranged within the semiconductor chip, and
wherein the BEOL wiring structure provides an electrical connection between an electronic active component integrated into the semiconductor chip and an external terminal of the semiconductor chip to transmit a signal generated in the semiconductor chip.

15. The method of claim 11, wherein the first planar waveguide transmission line and the second planar waveguide transmission line are each configured to transmit signals having a frequency of greater than 1 GHz.

16. The method of claim 11, wherein the first planar waveguide transmission line and the second planar waveguide transmission line each comprise two metal layers separated from one another by a dielectric material, and
wherein a first of the two metal layers comprises a ground layer and a second of the two metal layers comprises a signal-carrying metal layer.

17. The method of claim 11, wherein a distance between directly adjacent metal layers of the second planar waveguide transmission line is in a range of 2 micrometers to 20 micrometers.

* * * * *